US 8,562,273 B2

(12) United States Patent
Igarashi et al.

(10) Patent No.: US 8,562,273 B2
(45) Date of Patent: Oct. 22, 2013

(54) LOAD PORT APPARATUS

(75) Inventors: Hiroshi Igarashi, Tokyo (JP); Toshihiko Miyajima, Tokyo (JP)

(73) Assignee: TDK Corporation, Tokyo (JP)

( * ) Notice: Subject to any disclaimer, the term of this patent is extended or adjusted under 35 U.S.C. 154(b) by 65 days.

(21) Appl. No.: 13/212,576

(22) Filed: Aug. 18, 2011

(65) Prior Publication Data

US 2012/0051871 A1      Mar. 1, 2012

(30) Foreign Application Priority Data

Aug. 31, 2010   (JP) ................................ 2010-193286

(51) Int. Cl.
*H01L 21/677*        (2006.01)
(52) U.S. Cl.
CPC ............................. *H01L 21/67772* (2013.01)
USPC ...................................................... 414/217.1
(58) Field of Classification Search
CPC ....... H01L 21/67; H01L 21/673; H01L 21/68; H01L 21/687; H01L 21/67772; H01L 21/677
USPC ............................................. 414/217, 217.1
See application file for complete search history.

(56) References Cited

U.S. PATENT DOCUMENTS

| | | | | |
|---|---|---|---|---|
| 5,291,923 A | * | 3/1994 | Gallagher et al. | ............... 141/98 |
| 5,655,869 A | * | 8/1997 | Scheler et al. | ........... 414/222.01 |
| 5,810,537 A | * | 9/1998 | Briner et al. | ............... 414/217.1 |
| 6,013,920 A | * | 1/2000 | Gordon et al. | ........... 250/559.36 |
| 6,135,698 A | * | 10/2000 | Bonora et al. | ........... 414/416.01 |
| 6,188,323 B1 | * | 2/2001 | Rosenquist et al. | ....... 340/686.5 |
| 6,281,516 B1 | * | 8/2001 | Bacchi et al. | ............ 250/559.29 |
| 6,663,333 B2 | * | 12/2003 | Kinnard et al. | ............... 414/217 |
| 6,830,651 B2 | * | 12/2004 | Obikane | .................... 156/345.31 |
| 7,217,076 B2 | * | 5/2007 | Bonora et al. | ............. 414/217.1 |
| 7,370,764 B2 | * | 5/2008 | Nyseth et al. | .................. 206/711 |
| 8,096,744 B2 | * | 1/2012 | Okada et al. | .................. 414/217 |
| 2003/0012624 A1 | * | 1/2003 | Kinnard et al. | ............... 414/217 |
| 2005/0265812 A1 | | 12/2005 | Suzuki et al. | |
| 2009/0142170 A1 | * | 6/2009 | Natsume | .................. 414/222.07 |
| 2011/0076117 A1 | * | 3/2011 | Iizuka | ........................... 414/217 |

(Continued)

FOREIGN PATENT DOCUMENTS

JP       2003-347387        12/2003
JP       2004-165458 A       6/2004

OTHER PUBLICATIONS

U.S. Appl. No. 13/228,891, filed Sep. 9, 2011, Igarashi, et al.

(Continued)

*Primary Examiner* — Saul Rodriguez
*Assistant Examiner* — Brendan Tighe
(74) *Attorney, Agent, or Firm* — Oblon, Spivak, McClelland, Maier & Neustadt, L.L.P.

(57) ABSTRACT

Provided is a load port apparatus having a structure capable of resisting against a moment generated at a time of driving of a door increased in weight owing to upsizing. A pair of rectangular main bases, which project perpendicularly to an attachment surface of the load port apparatus and elongated parallel to the attachment surface, are coupled to each other with a coupling shaft, and the structural body including those components is fixed to the attachment surface through intermediation of I-shaped plates capable of being held in close surface contact with the attachment surface. Mechanisms of a door drive mechanism, a placing table, and the like are arranged on an inner side between the pair of main bases of the structural body.

8 Claims, 3 Drawing Sheets

(56) References Cited

U.S. PATENT DOCUMENTS

| | | | |
|---|---|---|---|
| 2011/0188974 A1* | 8/2011 | Diamond | 414/217 |
| 2011/0318141 A1* | 12/2011 | Wi | 414/217 |
| 2012/0051871 A1* | 3/2012 | Igarashi et al. | 414/217 |
| 2012/0063869 A1* | 3/2012 | Igarashi et al. | 414/217 |

OTHER PUBLICATIONS

Office Action issued Aug. 2, 2012 in Japanese Patent Application No. 2010-193286 with English language translation.

* cited by examiner

LOAD PORT APPARATUS

BACKGROUND OF THE INVENTION

1. Field of the Invention

The present invention relates to what is called a front-opening interface mechanical standard (FIMS) system, that is, a load port apparatus, which is used for transferring, from one semiconductor processing apparatus to another semiconductor processing apparatus, wafers held in a sealed-type transport container called a pod during a semiconductor manufacturing process and the like. More particularly, the present invention relates to a main-unit structure of a load port apparatus, which contributes to weight reduction of the structure as a whole.

2. Description of the Related Art

In recent years, in a general semiconductor manufacturing process, cleanliness is managed throughout the entire process by maintaining a highly clean state in only the following three spaces: inner spaces of various processing apparatuses; an inner space of a pod capable of housing wafers and transporting the wafers from one processing apparatus to another processing apparatus; and mini-environments in which the wafers are exchanged between the pod and the respective processing apparatuses. Such a pod includes a main-unit portion which houses wafers therein and which has a wafer-insertion-and-removal opening formed in one side surface, and a lid which makes the inside of the pod serve as a sealed space by closing the opening. Further, a structure that defines the mini-environment includes an opening portion capable of facing the above-mentioned opening of the pod and a second opening portion arranged on a semiconductor processing-apparatus side so as to face the opening portion.

The load port apparatus includes a member as a partition wall provided with the opening portion, that is, a wall called a side base, a door for closing the opening portion, a door drive mechanism for controlling operation of the door, and a placing table on which the pod is placed. A placing base on the placing table on which the pod is actually placed is capable of supporting the pod in such a manner as to face the opening of the pod and the opening portion each other, and brings the lid of the pod close to or separated from the door together with the pod itself. The door is capable of holding the lid of the pod, and retracted below the space between the opening portion and the second opening portion by the door drive mechanism while holding the lid. A robot is arranged in the mini-environment, and the robot is capable of entering into and retracting from the inside of the pod through the opening portion and the opening of the pod, and transfers wafers between the inside of the pod and the semiconductor processing apparatus also through the second opening portion.

In semiconductor manufacturing steps, an increase in a bore diameter of wafers to be used has been promoted for higher productivity. In accordance therewith, each of the above-mentioned pod, mini-environment, and space in the processing apparatus are also upsized. For example, the load port apparatus disclosed in Japanese Patent Application Laid-Open No. 2003-347387 enters a functionable state by fixing a side base, which is a vertical wall, to one side surface of a transport chamber of a processing apparatus. The one side surface is generally referred to as an attachment surface. Here, as the bore diameter of wafers increases, an enlargement of the opening portion of the load port apparatus and upsizing of the door in accordance therewith are also demanded. Such upsizing of the door involves an increase in weight of the door, and the door drive mechanism is required to have a larger actuation force according to the increased weight of the door.

Here, a side base disclosed in Japanese Patent Application Laid-Open No. 2003-347387 is formed of a single flat plate-like member. The side base is required to support the door and the door drive mechanism, and simultaneously have a rigidity sufficient against a dynamic load generated at the time of operations of the door and the door drive mechanism, that is, what is called a moment. However, along with the upsizing of the door and the like in recent years, it has become gradually difficult to secure the sufficient rigidity in conventional structures. Further, when such an attempt is made as to increase a thickness of the side base for the purpose of securing the sufficient rigidity, there is a risk that a weight of the side base increases, and it becomes more difficult to appropriately install the load port apparatus with respect to the processing apparatus.

SUMMARY OF THE INVENTION

The present invention has been made in view of the above-mentioned circumstances, and it is an object of the present invention to provide a load port apparatus capable of sufficiently supporting a moment generated along with opening and closing of an upsized door and capable of opening and closing an opening portion with a door operation with high accuracy.

In order to solve the above-mentioned problem, a load port apparatus according to an aspect of the present invention, which is to be attached to an attachment surface of a semiconductor processing apparatus, the attachment surface being provided with an opening portion for insertion and removal of an object-to-be-processed, and which opens and closes a lid of a pod as a sealed container arranged on an outside of the opening portion so that the object-to-be-processed is insertable into and removable from an inside of the pod through the opening portion, includes: a main base which is formed of a plate-like body and is to be arranged in such a manner as to project while maintaining a predetermined angle with respect to the attachment surface of the semiconductor processing apparatus; a connecting plate which is fixable to the attachment surface, for coupling the main base and the attachment surface to each other by being fastened to the main base so as to maintain the predetermined angle; a placing table which is supported by the main base and on which the pod is to be placed; a door which is capable of holding the lid of the pod and arranged on an interior side of the opening portion so as to open and close the opening portion; and a door drive mechanism which is supported by the main base, supports the door, and makes the door open and close the opening portion, in which the main base has such a shape that a rigidity against a force which acts in an in-plane direction of a plane parallel to a trace plane including a moving direction of the door driven by the door drive mechanism is higher than a rigidity against a force which acts in an in-plane direction of a plane perpendicular to both the trace plane and the attachment surface.

Further, in order to solve the above-mentioned problem, a load port apparatus according to another aspect of the present invention, which is to be attached to an attachment surface of a semiconductor processing apparatus, the attachment surface being provided with an opening portion for insertion and removal of an object-to-be-processed, and which opens and closes a lid of a pod as a sealed container arranged on an outside of the opening portion so that the object-to-be-processed is insertable into and removable from an inside of the pod through the opening portion, includes: a main base which is formed of a plate-like body and is to be arranged in such a manner as to project while maintaining a predetermined angle with respect to the attachment surface of the semiconductor processing apparatus; a connecting plate which is fixable to the attachment surface, for coupling the main base and the attachment surface to each other by being fastened to the main base so as to maintain the predetermined angle; a placing table which is supported by the main base and on which the pod is to be placed; a door which is capable of holding the lid of the pod and arranged on an interior side of the opening portion so as to open and close the opening portion; and a door drive mechanism which is supported by the main base, supports the door, and makes the door open and close the opening portion, in which the door drive mechanism includes a pair of door-raising-and-lowering guide rails used when the door is driven into such a direction as to be separated from a facing position where the door faces the opening portion, the pair of door-raising-and-lowering guide rails being elongated parallel to the attachment surface and fixed to the main base in such a manner that a plane including the pair of door-raising-and-lowering guide rails juxtaposed to each other intersects with the attachment surface.

Note that, in the load port apparatus according to any one of the aspects of the present invention, it is preferred that the connecting plate be formed of a flat-plate-like member, which is to be arranged parallel to the attachment surface and elongated parallel to the attachment surface, and the connecting plate have, at a fastening part with respect to the main base, a thickness set to be large in a direction perpendicular to the attachment surface. Further, it is preferred that the main base include multiple main bases, and the load port apparatus further includes a coupling shaft for coupling the multiple main bases integrally with each other. Further, it is more preferred that the main base include multiple main bases, the connecting plate be arranged correspondingly to each of the multiple main bases, and the door drive mechanism be arranged between the multiple main bases. In addition, it is more preferred that each of the door and the placing table be formed of a transparent resin.

According to the aspects of the present invention, the door and the door drive mechanism can be supported by a structural body having a rigidity higher than that of a side base formed of a single flat plate-like body, which has been conventionally an essential component. Further, the opening portion can be opened and closed with high accuracy even with respect to the upsized door. In addition, the side base can be markedly reduced in weight in comparison to that in the conventional structure. As a result, operations at the time of attachment of the load port apparatus to the semiconductor processing apparatus can be facilitated and performed with higher accuracy.

The above and other objects, features, and advantages of the invention will become more apparent from the following detailed description taken in conjunction with the accompanying drawings.

DESCRIPTION OF THE EMBODIMENT

Figure 1:
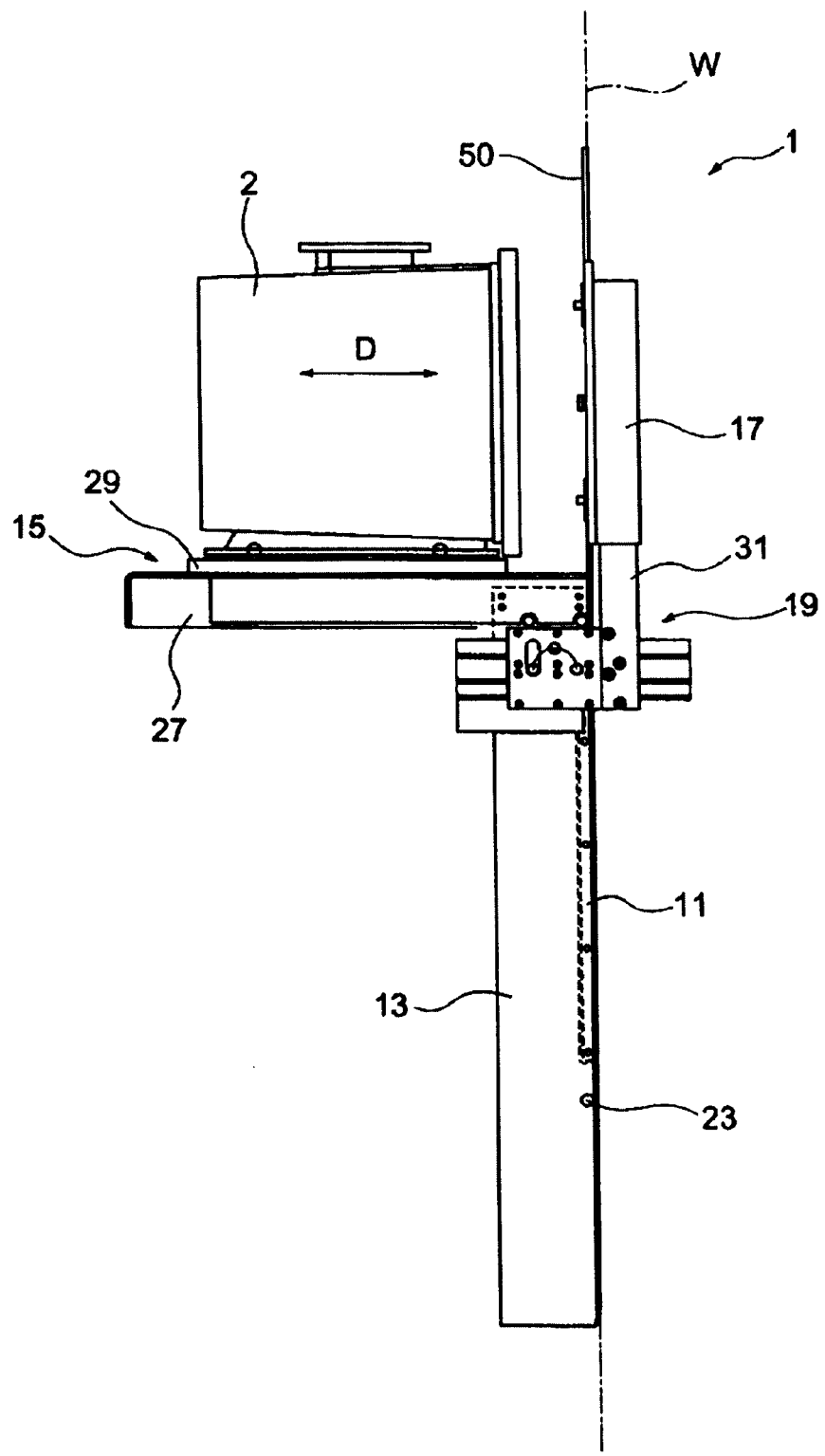
FIG. 1 is a view illustrating, from a side-surface side, a schematic configuration of a load port apparatus according to an embodiment of the present invention, under a state in which a pod is placed on the load port apparatus.
Figure 2:
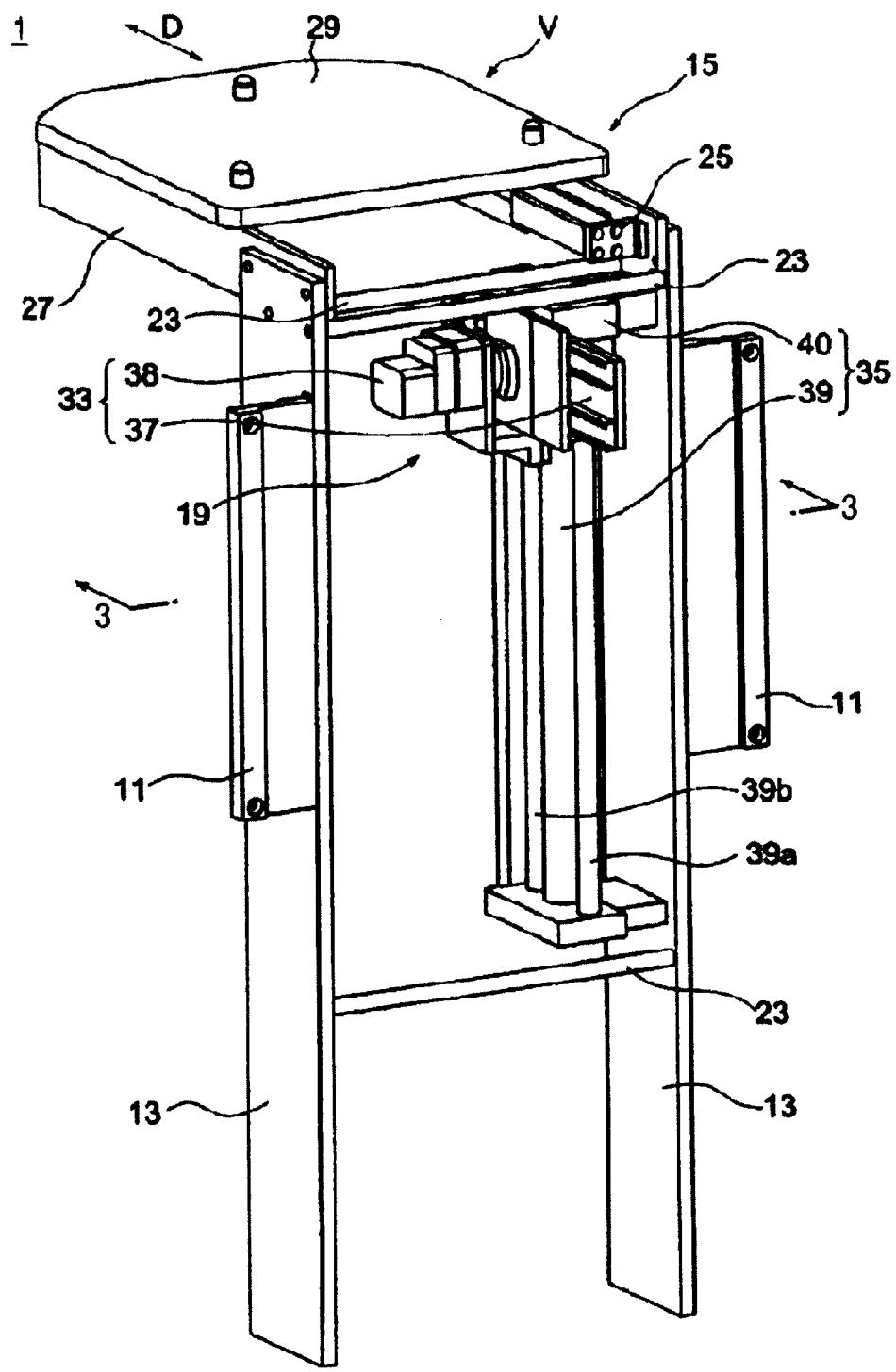
FIG. 2 is a perspective view illustrating, from an attachment-surface side, the schematic configuration of the load port apparatus illustrated in FIG. 1, under a state in which the pod and a door are removed from the load port apparatus.
Figure 3:
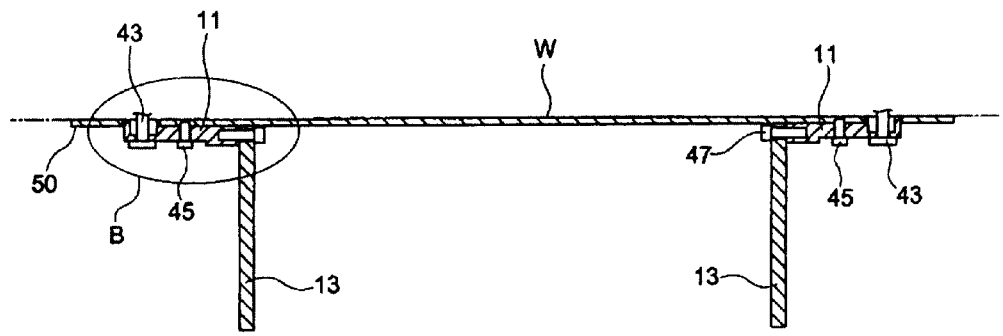
FIG. 3 is a view illustrating a state in which a cross-section, which is taken along the plane 3-3, of main bases and connecting plates illustrated in FIG. 2 is viewed in an arrow V direction.
Figure 4:
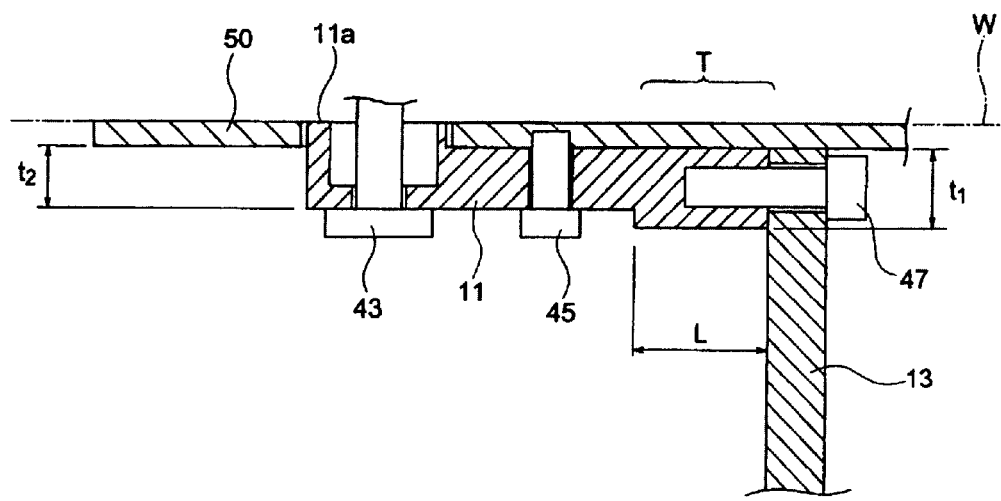
FIG. 4 is an enlarged view of the region B illustrated in FIG. 3.

In the following, an embodiment of the present invention is described with reference to figures. FIG. 1 illustrates, from a side-surface side, a schematic configuration of a load port apparatus according to the embodiment of the present invention, under a state in which a pod 2 is placed on a placing table. Further, FIG. 2 is a perspective view illustrating, from an attachment-surface side, the schematic configuration of the load port apparatus under a state in which a door is removed for the sake of simplification in description. FIG. 3 is a sectional view which is taken along the cross-section 3-3 of FIG. 2 and in which connecting plates, an opening-portion cover member, and main bases are viewed in an arrow V direction of FIG. 2. FIG. 4 is an enlarged view of the region B illustrated in FIG. 3. A load port apparatus 1 in this embodiment includes connecting plates 11, an opening-portion cover member 50, main bases 13, a placing table 15, a door 17, and a door drive mechanism 19. Note that, in an actual structure, a cover (not shown) for covering the door drive mechanism 19 and a pod drive mechanism 25 which is affixed to the placing table 15 so as to prevent dust scattering therefrom is arranged under the placing table 15. The cover defines a sealed space for housing those components. Further, a semiconductor processing apparatus having an attachment surface provided with an opening portion does not have a direct relation to this embodiment. Thus, the semiconductor processing apparatus is not described here with reference to figures. Note that, in the following description, an attachment surface W illustrated by a dashed line in FIG. 1 is one surface of a wall provided with an opening portion communicating to the above-mentioned semiconductor processing apparatus, that is, a surface positioned on an exterior side of the opening portion with respect to an interior side of an opening portion serving as a mini-environment on a semiconductor-processing-apparatus side.

Next, each of the components is described. In this embodiment, each of the main bases 13 is formed of a plate-like body having longitudinal sides, short sides, and a predetermined thickness. Thus, an elongated direction of each of the main bases 13 corresponds to a longitudinal direction thereof. Each of the connecting plates 11 is formed of a flat-plate-like member arranged and elongated parallel to the attachment surface W. The main bases 13 are used in pairs, and the connecting plates 11 corresponding respectively to the main bases 13 are arranged on an outside of the main bases 13 arranged so as to face each other. The connecting plates 11 are fixed to the attachment surface W and respectively support the main bases 13. The pair of main bases 13 are integrated by a bar-like coupling shaft 23 arranged therebetween and having both end portions held in contact respectively with the pair of main bases 13. When multiple coupling shafts 23 are arranged between the pair of main bases 13, the pair of main bases 13 and the multiple coupling shafts 23 function as a single rigid body. As a result, a structural body can be obtained which achieves marked reduction in weight in comparison to that of a conventional base plate formed of a single plate and has rigidity much higher than that of the conventional base plate. Further, the door drive mechanism 19 and the like are arranged between the main bases 13 facing each other, and hence the structural body including those components more effectively resists a moment received from the door 17 through intermediation of a raising-and-lowering guide described below for the door drive mechanism 19.

Further, the main bases 13 support the placing table 15 and the door drive mechanism 19. The placing table 15 includes table fixing portions 27 fixed to the main bases 13, the pod drive mechanism 25 supported by one of the table fixing portions 27, and a pod-support table 29 supported by the pod drive mechanism 25. The pod 2 is placed on and fixed to the pod-support table 29. The pod drive mechanism 25 moves the pod-support table 29 along a direction D perpendicular to an opening portion (not shown) so that the pod 2 is brought close to or separated from the opening portion. The door drive mechanism 19 supports, through intermediation of a door arm 31, the door 17 at such a position that the door 17 is capable of closing the opening portion under a predetermined drive condition. The door drive mechanism 19 includes multiple drive actuators. Through cooperation of those drive actuators, the door 17 is separated from the opening portion to the interior side and moved in a particular direction so as to open the opening portion. Referring to, for example, a center point of the door 17, an operating direction or a drive trace of the separation of the door 17 from the opening portion and the movement of the door 17 into the particular direction exists on a particular plane, that is, a trace plane.

The door drive mechanism 19 includes a first door-drive unit 33 for driving the door 17 so that the door 17 is brought close to and separated from the opening portion in a first direction toward the above-mentioned interior side, and a second door-drive unit for driving the door 17 along a second direction that is a direction different from the first direction. Note that, the second direction is orthogonal to the first direction. In this embodiment, the second direction is set to a vertical direction. In other words, the second direction is a direction in which the door 17 is moved from front of the opening direction to a lower side of the opening portion. The first door-drive unit 33 includes first guide rails 37 elongated in the first direction and a first drive source 38, and the second door-drive unit 35 includes second guide rails 39 elongated in the second direction and a second drive source 40. The respective drive sources of the door drive units move on the guide rails, and hence the door drive units are capable of moving in the respective directions. The first door-drive unit 33 directly supports the door 17 through intermediation of the door arm 31, and the second door-drive unit 35 supports the first door-drive unit 33. Note that, a direction recognizable as a direction including the moving direction of the door 17 in front of the opening portion corresponds to the above-mentioned first direction, and a direction recognizable as a moving direction of the door 17 at the time of retraction from front of the opening portion corresponds to the above-mentioned second direction. That is, the second direction is preferred to be recognized as a direction in which the door 17 moves in such a direction as to be separated from a facing position with respect to the opening portion.

Note that, the present invention has been made for the purpose of solving the problems with upsizing of the door and an increase of a weight of the door in accordance therewith. Thus, both the guide rails 37 and 39 are provided in pairs alternately perpendicularly to corresponding moving directions of the door 17. Specifically, because the door moves in the first direction, the first guide rails 37 are elongated in the first direction, and are arranged parallel to each other in the second direction perpendicular to the first direction. Further, the second guide rails 39 include a pair of second guide rails 39a and 39b elongated in the second direction and arranged parallel to each other in the first direction perpendicular to the second direction. The first guide rails 37 correspond to opening-portion-opening-and-closing guide rails of the present invention, and the second guide rails 39 correspond to door-raising-and-lowering guide rails of the present invention.

Next, with reference to FIGS. 3 and 4, for example, positional relations of the connecting plates 11 and the main bases 13 with respect to the attachment surface W are described in detail. The main base 13 is arranged in such a manner as to project from the attachment surface W while maintaining a predetermined angle (90° in this embodiment) with respect to the attachment surface W. Thus, a projecting direction of the main base 13 with respect to the attachment surface W is perpendicular to the attachment surface W. Note that, the main base 13 is a plate-like body having a predetermined thickness, and arranged so that the short sides thereof project from the attachment surface W and that longitudinal end surfaces are parallel to the attachment surface W. The connecting plate 11 has such a plate-like shape as to be held in close contact at least partially with the attachment surface W (close-contact region 11a in FIG. 4) and as to be capable of fixing a positional relation relative to the attachment surface W. More specifically, as illustrated in, for example, FIG. 4, the shape of the connecting plate 11 has such a cross-sectionally I-shaped plate-like shape elongated parallel to the attachment surface W. The connecting plate 11 is fixed to the attachment surface W with a first fastening member 43 such as a screw in such a manner that one surface of the connecting plate 11 is held in close contact with the attachment surface W. Further, the connecting plate 11 is fixed with a third fastening member 47 such as a screw in such a manner that a longitudinal end surface of the plate-like shape is struck against one surface of the plate-like shape of the main base 13. Through intermediation of the connecting plate 11 in such a manner, the main base 13 is fixed in such a state as to maintain a predetermined angle with respect to the attachment surface W.

Further, in this embodiment, the opening-portion cover member 50 is arranged between the connecting plate 11 and the attachment surface W. The opening-portion cover member 50 is fixed to the connecting plate 11 by a second fastening member 45, and defines a requisite minimum opening area by covering the opening portion provided in the attachment surface W. Specifically, the opening-portion cover member 50 is arranged between a structure arranged on a mini-environment side of the above-mentioned door drive mechanism 19 and a structure arranged on an outside of the mini-environment, and defines a part constituting a communication region between the mini-environment and the exterior space as the requisite minimum opening area for transportation of wafers. In this way, when the opening-portion cover member 50 and the connecting plate 11 are integrated with each other in advance, the load port apparatus can be attached to the semiconductor processing apparatus under a state in which a positional relation, for example, between the opening-portion cover member 50 and the door drive mechanism 19 is determined. Accordingly, manipulations such as positioning at the time of attachment of the load port apparatus with respect to the semiconductor processing apparatus can be simplified and facilitated.

Note that, on a fastening part of the connecting plate 11, which serves as a fastening surface struck against the main base 13, a region T is preferred to be arranged in which a thickness $t_1$ in the direction perpendicular to the attachment surface W is set larger than a thickness $t_2$ of another part. For example, in a case where the fastening members as described in this embodiment are used, in order to secure sufficient strength or a sufficient fastening force, the region T is preferred to have the thickness $t_1$ and a length L at least sufficient for housing the fastening members. Such region T added to the connecting plate 11 enables the connecting plate 11 to more firmly support the main base 13. As described hereinabove, the main base 13 is preferred to be supported by the connecting plate 11 having the above-mentioned particular shape (cross-sectional I-shape in this embodiment) and the first fastening member 43 and the third fastening member 47. Such a configuration enables even a thin plate member to accurately secure the projecting direction of the main base 13 and achieve sufficient coupling strength. However, the projecting direction and the type of the fastening members are not limited thereto, and various other configurations may be adopted. In addition, those members may be integrated with each other by welding or the like. Further, the connecting plate 11 may have a shape other than the cross-sectional I-shape depending on strength, attachment modes with respect to the main base 13, and the like.

As described above in this embodiment of the present invention, the pair of door-raising-and-lowering guide rails 39a and 39b are arranged in such a manner as to be elongated along the longitudinal direction of the main base 13 with respect to the attachment surface W, and juxtaposed in such a direction that the main base 13 is projected from the attachment surface W. When being driven, from a portion at which the door arm 31 and the door drive mechanism 19 are coupled to each other as a center, the door 17 generates a moment of force in such a direction as to be separated from an elongated direction of the door-raising-and-lowering guide rails 39a and 39b. Such an arrangement of the pair of door-raising-and-lowering guide rails 39a and 39b enables the most effective resistance against this moment. Further, the pair of opening-portion-opening-and-closing guide rails 37 is arranged in such a manner as to be elongated in the short direction of the main base 13 and juxtaposed in the longitudinal direction of the same. When being driven, from a portion at which the door arm 31 and the door drive mechanism 19 are coupled to each other as a center, the door 17 generates a moment of force in such a direction as to be separated from an elongated direction of the door-raising-and-lowering guide rails 39a and 39b. Such an arrangement of the pair of opening-portion-opening-and-closing guide rails 37 also enables the most effective resistance against this moment.

Note that, although both the door-raising-and-lowering guide rails 39a and 39b and the pair of opening-portion-opening-and-closing guide rails 37 are preferred to be used in a mode described here, the mode described here may be applied to only any one of them. In this case, the door-raising-and-lowering guide rails 39a and 39b, which are larger in driving amount of the door 17, are more preferred to be used in this mode. That is, the pair of door-raising-and-lowering guide rails 39a and 39b are each preferred to be elongated in the elongated direction of the main base 13 and fixed to the main base 13 so as to be parallel to such a direction that the main base 13 is projected from the attachment surface W. Further, in this case, such a definition is made that the pair of door-raising-and-lowering guide rails 39a and 39b are each fixed to the main base 13 in such a manner that a plane, which includes the pair of door-raising-and-lowering guide rails 39a and 39b each elongated parallel to the attachment surface W and juxtaposed to each other, intersects with the attachment surface W.

Alternatively, in the present invention, such a definition may be made that the projecting direction of the main base 13 with respect to the attachment surface W is not particularly limited and the main base has such a surface as to support the door drive mechanism 19 as a main surface, the main surface being arranged so as to be elongated in the plane elongated parallel to a plane including any one of the moving directions (advancement and retraction, raising and lowering, turning, and the like) of the door 17 at the time when the door drive mechanism 19 drives the door 17 so as to open and close the opening portion. Here, although the main surface may correspond to one surface of the plate-like main base 13, the main surface may correspond to another surface obtained through addition of a plane according to the above-mentioned definitions to a plate-like shape. Note that, in this case, the moving directions of the door 17 include directions at various timings when the gravity center of the door 17 moves within a range relating to opening and closing of the door 17 with respect to the opening portion. Further, the main surface may be defined to be parallel to a plane including movement traces of the gravity center.

Adoption of such modes enables resistance against the moment of force that can be generated along with operations of the door 17, the resistance being exerted not by the conventional side base formed of a plate-like body but by the structural body. In addition, the guide rails are positioned so as to exert highest rigidities against the direction in which this moment of force acts. Thus, displacement of the guide rails caused by such moment of force can be effectively suppressed. As a result, an operational end of each of the first door-drive unit 33 and the second door-drive unit 35 can be provided on a guide-rail side instead of a conventional side-base side so that an operation is repeated to the operational end with high accuracy. Further, the above-mentioned cover for the door drive mechanism 19 and the like is conventionally fixed to the attachment surface W. However, according to the present invention, the cover can be fixed to the connecting plate 11 or the main base 13 as described above. In other words, the cover can be fixed to the load port apparatus itself, which enables components having a high risk of dust scattering, such as the door drive mechanism 19, to be housed in the cover with high sealability. Further, the cover can be attached and detached more easily, which enables enhancement of maintenance properties in the housing space.

Further, although the main bases 13 are provided in pairs in this embodiment, a single main base 13 or a larger number of main bases 13 may be used. Still further, although the connecting plates 11 correspond respectively to the main bases 13, a one-to-many relation may be established therebetween. Yet further, although the main base 13 projects from the attachment surface W while maintaining a predetermined angle of 90° with respect to the attachment surface W, the projecting angle is not limited thereto. Yet further, the elongated direction is not limited to the vertical direction. The moment of force generated along with driving of the door, against which the load port apparatus must resist as an object of the present invention, becomes a force which acts in an in-plane direction of a plane parallel to the trace plane formed of traces around the door center, which include the operating direction of the door 17 driven by the door drive mechanism 19. Thus, it suffices that the projecting angle with respect to the attachment surface W, the elongated direction, and the number of the main base 13 are set such that a rigidity against a force which acts in the in-plane direction of the plane parallel to the trace plane is higher than a rigidity against a force which acts in an in-plane direction of a plane perpendicular to both the trace plane and the attachment surface W. Note that, in this embodiment, although the operations of the door are linearly performed along two axes, for example, as for approach and separation with respect to the opening portion, a rotational operation, for example, about a particular axis may be performed. Also in this case, when traces of a predetermined part of the door, which are formed by the rotational operation and the raising and lowering operations, exist in a particular plane, the advantageous effects of the present invention can be obtained through satisfaction of the above-mentioned condition.

Further, in the present invention, fundamental rigidities of the load port apparatus can be exerted by the connecting plates 11, the main bases 13, and the coupling shafts 23. Thus, it becomes less necessary to maintain strengths of the door 17 and the placing table 15 to be equal to or higher than those of conventional ones, and hence those members may be formed of a resin material. With this, weights of those members can be reduced, and hence a weight of the load port apparatus itself can be reduced. As a result, operations such as attachment of the load port apparatus with respect to the semiconductor processing apparatus can be facilitated. Further, with use of a transparent resin material, operations of the robot arranged on the semiconductor-processing-apparatus side can be directly and visually confirmed.

As described hereinabove, the present invention relates to a load port apparatus used suitably to semiconductor processing apparatuses. However, the present invention is applicable not only to the semiconductor processing apparatuses but also to what is called load port apparatuses used for various processing apparatuses in which various processes conforming to those for semiconductors are performed, such as processing apparatuses which handle panels for liquid crystal displays.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2010-193286, filed Aug. 31, 2010, which is hereby incorporated by reference herein in its entirety.

What is claimed is:

1. A load port apparatus, which is to be attached to an attachment surface of a semiconductor processing apparatus, the attachment surface being provided with an opening portion for insertion and removal of an object-to-be-processed, and which opens and closes a lid of a pod as a sealed container arranged on an outside of the semiconductor processing apparatus with respect to the attachment surface so that the object-to-be-processed is insertable into and removable from an inside of the pod through the opening portion, the load port apparatus comprising:
    a main base which is formed of a plate-like body and is to be arranged in such a manner as to project while maintaining a predetermined angle with respect to the attachment surface of the semiconductor processing apparatus;
    a connecting plate which is fixable to the attachment surface, for coupling the main base and the attachment surface to each other by being fastened to the main base so as to maintain the predetermined angle;
    a placing table which is directly connected to and supported by the main base and on which the pod is to be placed;
    a door which is capable of holding the lid of the pod, for opening and closing the opening portion from an interior side of the semiconductor processing apparatus with respect to the attachment surface; and
    a door drive mechanism which is directly connected to and supported by the main base, supports the door, and makes the door open and close the opening portion,
    wherein the door drive mechanism is fixed to a main surface of the main base, the main surface being elongated in a plane parallel to a plane including a moving direction of the door at a time when the door drive mechanism makes the door open and close the opening portion,
    wherein the main base includes a first and second main base, wherein an inner surface of the first main base faces an inner surface of the second main base, and wherein the load port apparatus further comprises a coupling shaft extending between the inner surfaces of the first and second main bases for coupling the multiple main bases integrally with each other.

2. A load port apparatus according to claim 1,
    wherein the connecting plate is formed of a cross-sectionally I-shaped flat-plate-like member, which is to be arranged parallel to the attachment surface and elongated parallel to the attachment surface, and
    wherein the connecting plate has, at a fastening part with respect to the main base, a thickness set to be large in a direction perpendicular to the attachment surface.

3. A load port apparatus according to claim 1,
    wherein the main base comprises multiple main bases,
    wherein the connecting plate is arranged correspondingly to each of the multiple main bases, and
    wherein the door drive mechanism is arranged between the multiple main bases.

4. A load port apparatus according to claim 1, wherein each of the door and the placing table is formed of a transparent resin.

5. A load port apparatus, which is to be attached to an attachment surface of a semiconductor processing apparatus, the attachment surface being provided with an opening portion for insertion and removal of an object-to-be-processed, and which opens and closes a lid of a pod as a sealed container arranged on an outside of the semiconductor processing apparatus with respect to the attachment surface so that the object-to-be-processed is insertable into and removable from an inside of the pod through the opening portion, the load port apparatus comprising:
    a main base which is formed of a plate-like body and is to be arranged in such a manner as to project while maintaining a predetermined angle with respect to the attachment surface of the semiconductor processing apparatus;
    a connecting plate which is fixable to the attachment surface, for coupling the main base and the attachment surface to each other by being fastened to the main base so as to maintain the predetermined angle;
    a placing table which is directly connected to and supported by the main base and on which the pod is to be placed;
    a door which is capable of holding the lid of the pod, for opening and closing the opening portion from an interior side of the semiconductor processing apparatus with respect to the attachment surface; and
    a door drive mechanism which is directly connected to and supported by the main base, supports the door, and makes the door open and close the opening portion,
    wherein the door drive mechanism comprises a pair of door-raising-and-lowering guide rails used when the door is driven into such a direction as to be separated from a facing position where the door faces the opening portion, the pair of door-raising-and-lowering guide rails being elongated parallel to the attachment surface and fixed to the main base in such a manner that a plane comprising the pair of door-raising-and-lowering guide rails juxtaposed to each other intersects with the attachment portion, wherein the main base includes a first and second main base, wherein an inner surface of the first main base faces an inner surface of the second main base, and wherein the load port apparatus further comprises a coupling shaft extending between the inner surfaces of the first and second main bases for coupling the multiple main bases integrally with each other.

6. A load port apparatus according to claim 5,
wherein the connecting plate is formed of a cross-sectionally I-shaped flat-plate-like member, which is to be arranged parallel to the attachment surface and elongated parallel to the attachment surface, and
wherein the connecting plate has, at a fastening part with respect to the main base, a thickness set to be large in a direction perpendicular to the attachment surface.

7. A load port apparatus according to claim 5, wherein the connecting plate is arranged correspondingly to each of the first and second main bases, and wherein the door drive mechanism is arranged between the first and second main bases.

8. A load port apparatus according to claim 5, wherein each of the door and the placing table is formed of a transparent resin.

\* \* \* \* \*